US 10,560,083 B2

(12) United States Patent
Balpe et al.

(10) Patent No.: US 10,560,083 B2
(45) Date of Patent: Feb. 11, 2020

(54) CONTROL DEVICE FOR POWER SUPPLY LINE

(71) Applicant: SAFRAN ELECTRICAL & POWER, Blagnac (FR)

(72) Inventors: Cedric Balpe, Brunoy (FR); Tony Lhommeau, Lieusaint (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 280 days.

(21) Appl. No.: 15/538,730

(22) PCT Filed: Dec. 18, 2015

(86) PCT No.: PCT/FR2015/053623
§ 371 (c)(1),
(2) Date: Jun. 22, 2017

(87) PCT Pub. No.: WO2016/102840
PCT Pub. Date: Jun. 30, 2016

(65) Prior Publication Data
US 2017/0366179 A1    Dec. 21, 2017

(30) Foreign Application Priority Data

Dec. 23, 2014    (FR) ..................... 14 63206

(51) Int. Cl.
*H03K 17/60*    (2006.01)
*H03K 17/0412*    (2006.01)
(Continued)

(52) U.S. Cl.
CPC ....... *H03K 17/04113* (2013.01); *H02H 3/025* (2013.01); *H02H 3/087* (2013.01);
(Continued)

(58) Field of Classification Search
CPC .......... H02H 3/025; H02H 3/087; H02H 9/02; H03K 17/04113; H03K 17/04126;
(Continued)

(56) References Cited

U.S. PATENT DOCUMENTS 4,567,476 A * 1/1986 Lang ..................... G01R 15/04
340/636.15
5,420,780 A    5/1995 Bernstein et al.
(Continued)

FOREIGN PATENT DOCUMENTS

CN    102122948 A    7/2011
WO    WO 2008/057222 A2    5/2008
(Continued)

OTHER PUBLICATIONS

International Search Report dated Feb. 22, 2016 in PCT/FR2015/053623 filed Dec. 18, 2015.

*Primary Examiner* — Zeev V Kitov
(74) *Attorney, Agent, or Firm* — Oblon, McClelland, Maier & Neustadt, L.L.P.

(57) ABSTRACT

A control device for connecting between two portions of an electrical power supply line. The device includes a bipolar transistor including a wide bandgap semiconductor material and having its emitter connected to one portion of the power supply line, its collector connected to another portion of the power supply line, and the device also including control connected to the base of the transistor.

8 Claims, 4 Drawing Sheets

(51) Int. Cl.
*H03K 17/081* (2006.01)
*H03K 17/22* (2006.01)
*H02H 9/02* (2006.01)
*H02H 3/087* (2006.01)
*H02H 3/02* (2006.01)
*H03K 17/041* (2006.01)
*H03K 17/74* (2006.01)

(52) U.S. Cl.
CPC ......... *H02H 9/02* (2013.01); *H03K 17/04126* (2013.01); *H03K 17/08112* (2013.01); *H03K 17/60* (2013.01); *H03K 17/74* (2013.01); *H03K 2017/226* (2013.01)

(58) Field of Classification Search
CPC .. H03K 17/08112; H03K 17/60; H03K 17/74; H03K 2017/226
USPC ........................................................ 361/91.5
See application file for complete search history.

(56) References Cited

U.S. PATENT DOCUMENTS

| | | | |
|---|---|---|---|
| 6,192,435 B1 * | 2/2001 | Takahashi | G06F 13/4081 361/58 |
| 2003/0218845 A1 | 11/2003 | Chen | |
| 2008/0137249 A1 | 6/2008 | Harris | |
| 2010/0277847 A1 | 11/2010 | Li | |
| 2010/0283529 A1 * | 11/2010 | Zhang | H01L 25/18 327/440 |
| 2010/0308582 A1 * | 12/2010 | Rozman | H02M 3/156 290/31 |
| 2012/0293017 A1 | 11/2012 | Lidsky et al. | |
| 2015/0116881 A1 | 4/2015 | Burnett et al. | |

FOREIGN PATENT DOCUMENTS

| | | |
|---|---|---|
| WO | WO 2012/148774 A2 | 11/2012 |
| WO | WO 2013/127463 A1 | 9/2013 |

* cited by examiner

CONTROL DEVICE FOR POWER SUPPLY LINE

BACKGROUND OF THE INVENTION

The invention relates to the general field of electrical power supply, and more particularly to control devices connected in electrical power supply lines.

It is common practice to use devices connected in power supply lines in order to control the current flowing in such lines. Such devices also serve to provide protection against certain events such as short circuits or the occurrence of lightning.

Such devices may be electronically controlled and they are generally referred to by the person skilled in the art as solid state power controllers (SSPCs). They operate in a manner analogous to an electronic circuit breaker.

It may be observed that in such devices, a current is measured, and it is as a function of the measured value of this current that a decision is taken on how to control a semiconductor component of the insulated gate bipolar transistor (IGBT) type or of the metal oxide on silicon field effect transistor (MOSFET) type, i.e. whether it is to occupy a conductive state or a non-conductive state.

Certain applications involve using high voltage direct current (HVDC) on electrical power supply lines. Under such circumstances, present devices are not satisfactory concerning their level of losses, their level of integration, and the level of protection that they provide.

The invention seeks in particular to mitigate such drawbacks.

OBJECTS AND SUMMARY OF THE INVENTION

The present invention satisfies this need by proposing a control device to be arranged between two portions of an electrical power supply line.

According to a general characteristic, the device comprises a bipolar transistor comprising a wide bandgap semiconductor material and having its emitter connected to one portion of the power supply line, its collector connected to another portion of the power supply line, and the device also comprising control means connected to the base of said transistor and configured to operate in an open loop.

The inventors have observed that using a bipolar transistor comprising a wide bandgap semiconductor material makes it possible to obtain accurate limitation of the current flowing through the transistor. As a result, adjustable limitation is obtained that is well suited in the event of short circuits or lightning appearing. This limitation is intrinsic to the structure of the transistor comprising wide bandgap semiconductor material.

This is very different from prior art solutions that operate in a manner analogous to a circuit breaker and that do not serve to limit the current flowing in the electrical power supply line.

It may be observed that obtaining current limitation makes it possible also to obtain additional protection compared with prior art devices, which generally operate between two states: conductive and non-conductive. With the invention, an abnormal increase in current can be handled by the intrinsic limitation that appears in the transistor.

This is particularly advantageous in applications to aircraft, within which it is not always possible to consider completely interrupting the flow of current in the event of an event such as lightning occurring.

It may also be observed that when a short circuit appears in the load that is powered by the power supply line, the temperature rises. Transistors comprising a wide bandgap semiconductor material then present a limitation on the current passing through them, this limitation being strengthened with an increasing temperature. In other words, the current passing through such transistors decreases when the temperature rises, thereby providing additional protection resulting from using the wide bandgap semiconductor material.

Thus, unlike prior art devices that make use of silicon components, in the invention losses are limited by using wide bandgap semiconductor material.

The term "comprising a wide bandgap semiconductor material" should be understood to mean a transistor in which at least a region of the base of the transistor comprises a wide bandgap semiconductor material, at least a region of the emitter comprises a wide bandgap semiconductor material, and at least a region of the collector comprises a wide bandgap semiconductor material. By way of example, such a transistor may be made within a wafer of the wide bandgap semiconductor material.

Unlike prior art solutions that require the use of a probe on the power supply line for measuring the current flowing therein, and then allowing that current to pass or not, in the present invention, it is possible to control the transistor directly so that it supplies a desired current, and to do so without measuring the current flowing in the line. It is using a bipolar transistor comprising a wide bandgap semiconductor material that makes this possible, since such transistors specifically limit the current that they pass.

In a particular embodiment, said control means are configured to deliver a current to the base of said transistor, the value of that current being selected to limit the current flowing in the power supply line portions to a maximum value.

In a particular embodiment, the control means comprise a switch configured to connect the base of said transistor either to an input of the device for receiving a first transistor control current, or else to at least one other input of the device for receiving a second transistor control current. Thus, several control current levels can be used as a function of the desired application, e.g. as a function of the desired limitation level.

In a particular embodiment, the control means comprise an adjustable voltage generator and a resistor.

In a particular embodiment, the device further comprises at least one diode connected in series with the resistor and the adjustable voltage generator.

Diodes are electronic components that are influenced by temperature, which makes it possible to adjust the current flowing to the base of the transistor, and thus to take into account the temperature upstream from the control of the transistor, so that the current is indeed limited in the expected manner when temperature conditions vary.

In another particular embodiment, the electrical power supply line is for receiving a high voltage direct current.

In another particular embodiment, the wide bandgap semiconductor material is selected from the group constituted by: silicon carbide (SiC); gallium nitride (GaN); and gallium arsenide (AsGa).

The invention also provides a system including a power supply, a load, and at least one power supply line connecting said power supply to said load, and at least one device as defined above connected between two portions of said at least one power supply line.

BRIEF DESCRIPTION OF THE DRAWINGS

Other characteristics and advantages of the present invention appear from the following description given with reference to the accompanying drawings, which show an example having no limiting character.

In the figures.

DETAILED DESCRIPTION OF AN EMBODIMENT

There follows a description of embodiments of the invention in which the wide bandgap semiconductor material is silicon carbide. Other materials can nevertheless be used, in particular gallium nitride or gallium arsenide.

Figure 1:
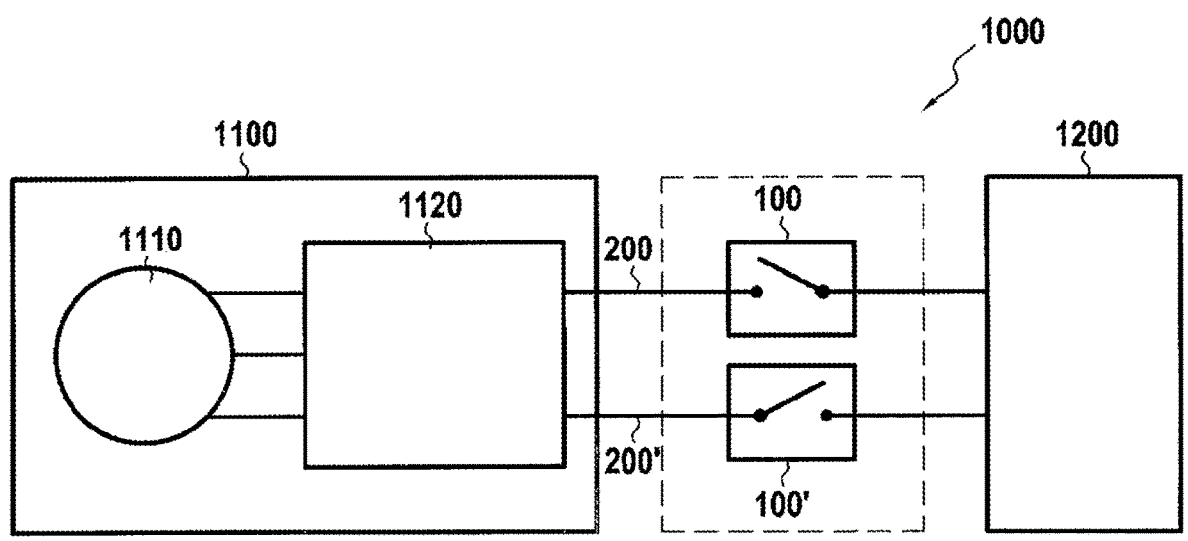
FIG. 1 is a diagram of a system in an embodiment of the invention.

FIG. 1 is a diagram showing control devices 100 and 100' used in a high voltage direct current (HVDC) system 1000. More precisely, the control device 100 is connected in a power supply line 200 presenting a positive potential, and the device 100' is connected in a neutral line 200'.

The lines 200 and 200' lead to a power supply 1100 producing high voltage DC. This power supply 1100 comprises a three-phase alternating current (AC) generator 1100 and an AC/DC converter 1120.

Finally, the power supply lines 200 and 200' are for powering a load 1200 that is to be powered with high voltage DC.

Figure 2:
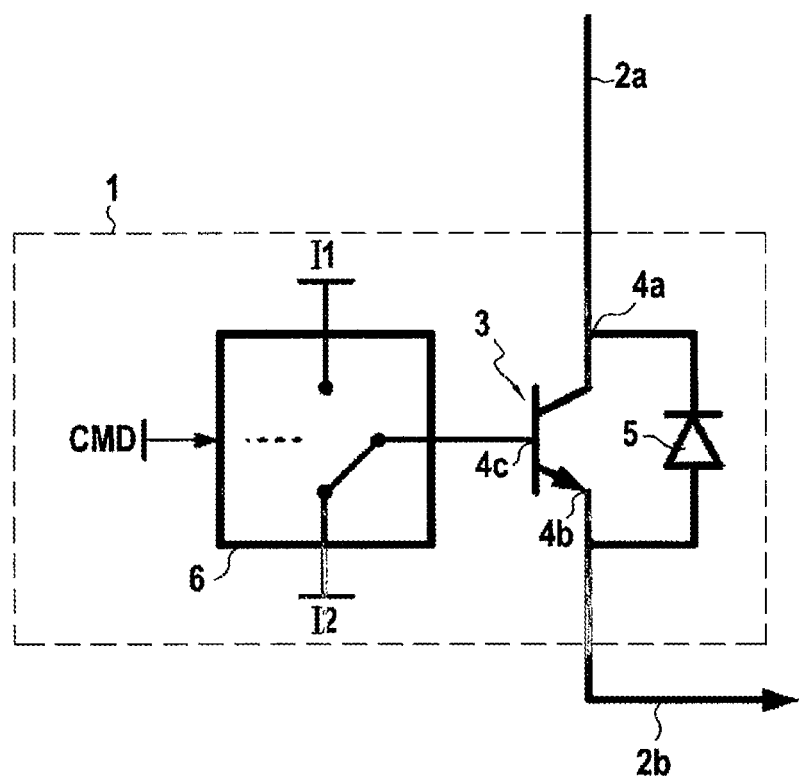
FIG. 2 is a circuit diagram of a device in an embodiment of the invention.

FIG. 2 shows a control device 1 connected between two portions 2a and 2b of the same power supply line, e.g. an electrical power supply line for receiving high voltage DC.

The portion 2a of the power supply line may be connected to a voltage source, and the portion 2b of the power supply line may be connected to a load to be powered.

The device 1 serves to limit the current that can flow in the power supply line. As a result, the device 1 also serves to provide protection against short circuits appearing in a load connected to the power supply line, or indeed against lightening.

The device 1 comprises a bipolar transistor 3 including silicon carbide. By way of example, such a transistor may be made within a wafer of silicon carbide, and its emitter, its collector, and its base may comprise silicon carbide.

By way of indication, it is possible to use the bipolar transistor comprising silicon carbide that is sold under the reference FSICBH017A120 by the American supplier Fairchild Semiconductor.

The collector 4a of the transistor 3 is connected to the portion 2a of the power supply line, and the emitter 4b of the transistor 3 is connected to the other portion 2b of the power supply line. The transistor 3 also presents an anti-parallel diode 5. It is in this configuration that the transistor limits the current flowing through it, which is the current flowing through the power supply line.

In order to control the transistor 3, the base 4c of the transistor is connected to control means 6. The control means 6 deliver current to the base 4c of the transistor 3, which current is associated directly with the value of the current that it is desired to pass through the transistor 3.

In the example of FIG. 1, the control means 6 comprise a switch, capable of connecting the base 4c of the transistor 3 to a current I1 corresponding to the transistor 3 being in a conductive state, or to a current I2 corresponding to the transistor 3 being in a non-conductive state. The current I1 is selected as a function of the maximum current that is to pass through the transistor 3.

The switch of the control means 6 receives a control signal CMD that connects the base 4c of the transistor 3 to one or the other of the inputs respectively receiving the currents I1 and I2.

It may be observed that the control means 6 operate in an open loop, without feedback: there is no need to measure the current flowing in the power supply line in order to adjust this current, since the transistor provides accurate limitation of the current. Indeed no sensor is provided. Limitation is thus intrinsic to the bipolar transistor, and it suffices to adjust it by means of the base of the transistor.

Figure 3:
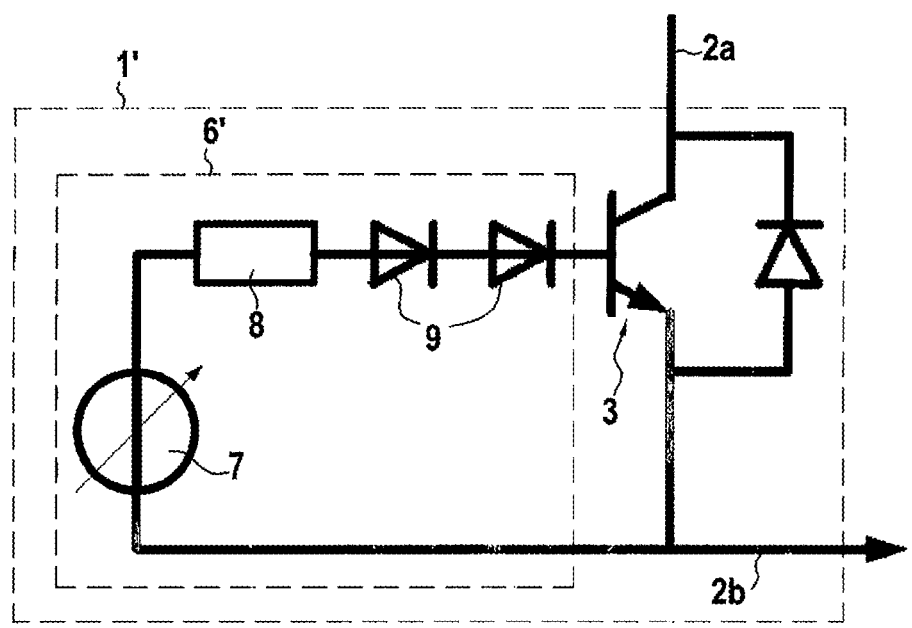
FIG. 3 is a circuit diagram of a device in another embodiment of the invention.

With reference to FIG. 3, there follows a description of a variant of the invention in which the control means use a voltage generator. Elements that are analogous to FIGS. 1 and 2 are given the same references.

In FIG. 3, a control device 1' has control means 6'. The control means 6' comprise in series and starting from a connection point to the portion 2b: an adjustable voltage generator 7, a resistor 8, and two diodes 9, the cathode of the last diode being connected to the base of the transistor 3. The use of a voltage generator with a resistor serves to provide a current that depends on the resistance of the resistor and on the voltage across the terminals of the generator.

By way of indication, it is possible to use an adjustable voltage generator of the linear regulator type, e.g. a series or parallel linear regulator.

It is also possible to use a switch mode regulator, e.g. a DC/DC regulator. The voltage generated by the voltage generator 7 can produce a current that controls the base of the transistor 3. When temperature varies, the diodes 9 compensate such temperature variations so as to maintain the same limitation on the current that flows in the power supply line.

Figure 4:
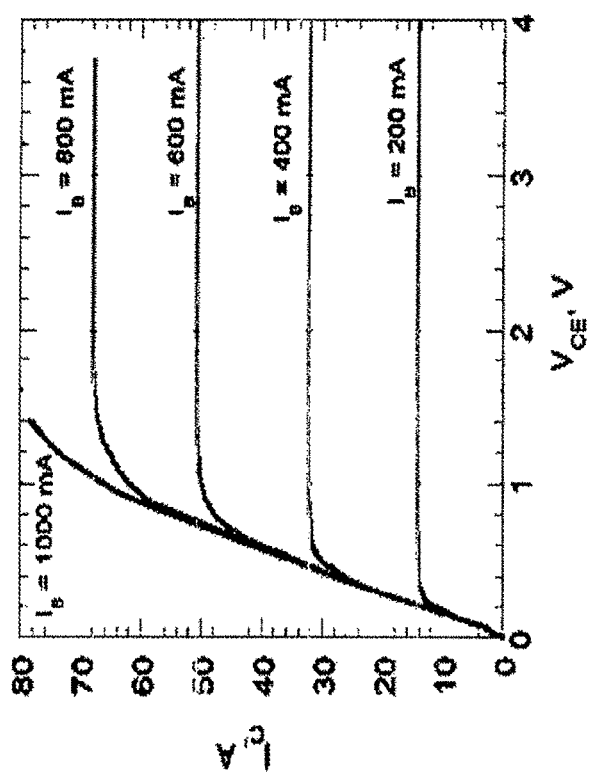

FIG. 4 shows a current-voltage characteristic of the transistor 3, e.g. the transistor 3 of the device 1 in FIG. 1. In the example of FIG. 3, the transistor 3 is used at a temperature of 25° C.

In this figure, the voltage $V_{CE}$ between the collector and the emitter of the transistor is plotted along the abscissa axis, and the current $I_C$ passing through the transistor is plotted up the ordinate axis.

Various curves are plotted as a function of the current $I_D$ passing through the base of the transistor.

The use of a bipolar transistor comprising silicon carbide makes it possible to obtain limitation of the current $I_C$, even at high currents of several tens of amps.

It is thus advantageous to use such transistors for applications in which the electricity power supply line is for receiving high voltage DC.

Figure 5:
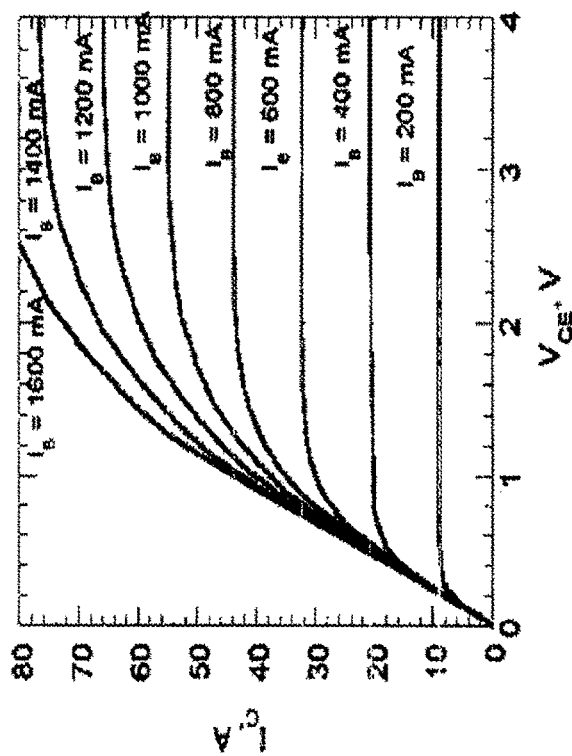
FIGS. 4 and 5 show current-voltage characteristics of a transistor in a device in an embodiment of the invention.

As can be seen in FIG. 5, which corresponds to using the transistor at a temperature of 150° C., the current $I_C$ corresponding to a value of the current $I_B$ decreases compared with operation at 25° C. By way of indication, the current $I_C$ for a current $I_B$ goes from 50 amps (A) to about 33 A.

It may be observed that depending on the application, this variation may be acceptable, since it means that the current is limited to no more than 50 A, regardless of temperature conditions. This makes it possible to reduce risks associated with short circuits and with lightning.

Alternatively, it is possible to compensate for temperature variations by using diodes, as shown in the example of FIG. 3.

It may also be observed that the drop in current that accompanies an increase in temperature provides additional protection. Specifically, when a short circuit appears, temperature increases, and the device of the invention intrinsically reduces the current passing through it.

Figure 6:
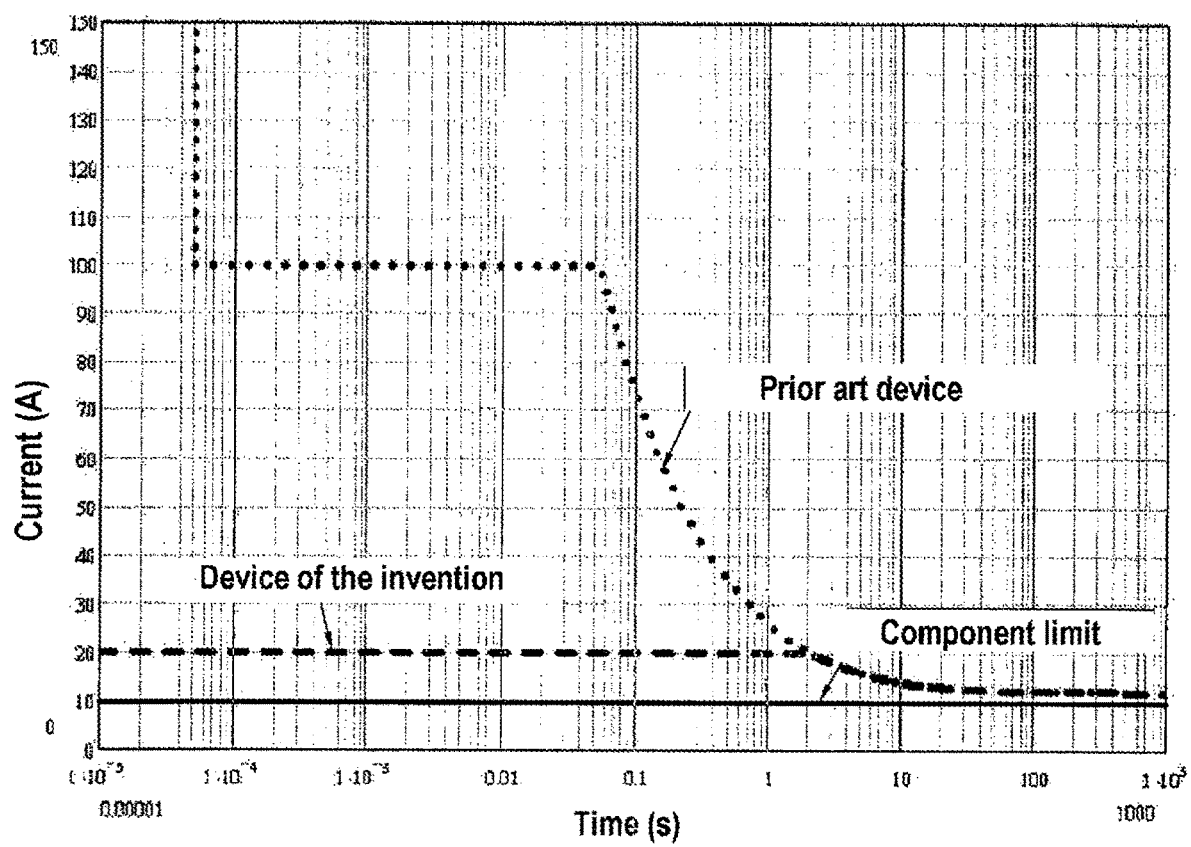
FIG. 6 shows how current varies in a power supply line as a function of time.

FIG. 6 shows how the current flowing in a power supply line varies over time when current increases, e.g. as a result of a short circuit.

The nominal value of the current in this example is represented by a continuous line giving a value of 10 A.

With prior art solutions behaving like electronic circuit breakers, the current reaches values of about 100 A prior to action being taken to cause the current to drop, e.g. by controlling a switch.

The invention makes it possible to prevent the current exceeding 20 A at any time, as a result of the structure of the bipolar transistors including a wide bandgap semiconductor material.

The invention claimed is:

1. A control device to be arranged between two portions of an electrical power supply line, the device comprising:
   a bipolar transistor comprising a wide bandgap semiconductor material and having its emitter connected to one portion of the power supply line, its collector connected to another portion of the power supply line; and
   a control circuit connected to the base of said transistor and configured to operate in an open loop without feedback.

2. The device according to claim 1, wherein said control circuit is configured to deliver a current to the base of said transistor, the value of that current being selected to limit the current flowing in the power supply line portions to a maximum value.

3. The device according to claim 1, wherein the control circuit includes a switch configured to connect the base of said transistor either to an input of the device for receiving a first transistor control current, or else to at least one other input of the device for receiving a second transistor control current.

4. The device according to claim 1, wherein the control circuit includes an adjustable voltage generator and a resistor.

5. The device according to claim 4, further comprising at least one diode connected in series with the resistor and the adjustable voltage generator.

6. The device according to claim 1, wherein the electrical power supply line is for receiving a high voltage direct current.

7. The device according to claim 1, wherein the wide bandgap semiconductor material is selected from the group constituted by: silicon carbide; gallium nitride; and gallium arsenide.

8. A system, comprising:
   a power supply,
   a load,
   at least one power supply line connecting said power supply to said load, and
   at least one device according to claim 1 connected between two portions of said at least one power supply line.

* * * * *